(12) United States Patent
Kuo et al.

(10) Patent No.: US 11,725,120 B2
(45) Date of Patent: Aug. 15, 2023

(54) CARRIER TAPE SYSTEM AND METHODS OF MAKING AND USING THE SAME

(71) Applicant: Taiwan Semiconductor Manufacturing Co., Ltd., Hsinchu (TW)

(72) Inventors: Chen-Ming Kuo, Hsinchu (TW); Jing Ruei Lu, Taipei (TW); Pei-Haw Tsao, Tai-chung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 640 days.

(21) Appl. No.: 16/668,914

(22) Filed: Oct. 30, 2019

(65) Prior Publication Data

US 2021/0134635 A1    May 6, 2021

(51) Int. Cl.
| | |
|---|---|
| *H01L 21/677* | (2006.01) |
| *C09J 5/00* | (2006.01) |
| *H01L 21/683* | (2006.01) |
| *C09J 7/38* | (2018.01) |
| *C09J 7/20* | (2018.01) |
| *H01L 21/673* | (2006.01) |
| *H05K 13/00* | (2006.01) |

(52) U.S. Cl.
CPC . *C09J 5/00* (2013.01); *C09J 7/20* (2018.01); *C09J 7/381* (2018.01); *H01L 21/67333* (2013.01); *H01L 21/6836* (2013.01); *C09J 2203/326* (2013.01); *C09J 2301/416* (2020.08); *C09J 2301/502* (2020.08); *C09J 2427/00* (2013.01); *H05K 13/0084* (2013.01)

(58) Field of Classification Search
CPC .................................. H01L 21/67721
See application file for complete search history.

(56) References Cited

U.S. PATENT DOCUMENTS 5,769,237 A * 6/1998 Althouse ............ H05K 13/0417
                                                    206/460
6,412,641 B1 * 7/2002 Anderson .............. B65D 73/02
                                                    206/460

* cited by examiner

*Primary Examiner* — Daniel H Lee
(74) *Attorney, Agent, or Firm* — Seed IP Law Group LLP

(57) ABSTRACT

The current disclosure describes carrier tape systems, which include a carrier tape including a plurality of pockets. Each pocket contains a semiconductor device adhered to a bottom surface of the pocket by an adhesive. In some embodiments, the adhesive is a reversible adhesive. Use of the adhesive reduces the likelihood the semiconductor device will be damaged due to movement of the semiconductor device in the pocket during shipment of the carrier tape. Methods of forming a semiconductor device carrier systems and methods of supplying semiconductor devices are also described.

20 Claims, 6 Drawing Sheets

CARRIER TAPE SYSTEM AND METHODS OF MAKING AND USING THE SAME

BACKGROUND

This disclosure relates generally to a carrier tape system for semiconductor devices and components thereof, and in some embodiments, to methods of using carrier tapes.

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level chip scale packaging (WLCSP) is widely used for its low cost and relatively simple manufacturing operations. During the WLCSP operation, a number of semiconductor components are assembled on a semiconductor device.

Such devices are shipped to customers in various packaging configurations. One example of semiconductor device shipping is based on tape and reel packaging systems. In the tape and reel format, components are placed in specifically designed pockets embossed in a carrier tape body. The pockets may be sealed with a cover tape to hold components placed in the pockets. Sprocket holes may be provided along one or both margins of the carrier tape to enable the tape to be moved by automated equipment. The tape is wound onto a plastic reel for labeling and packaging before shipment.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
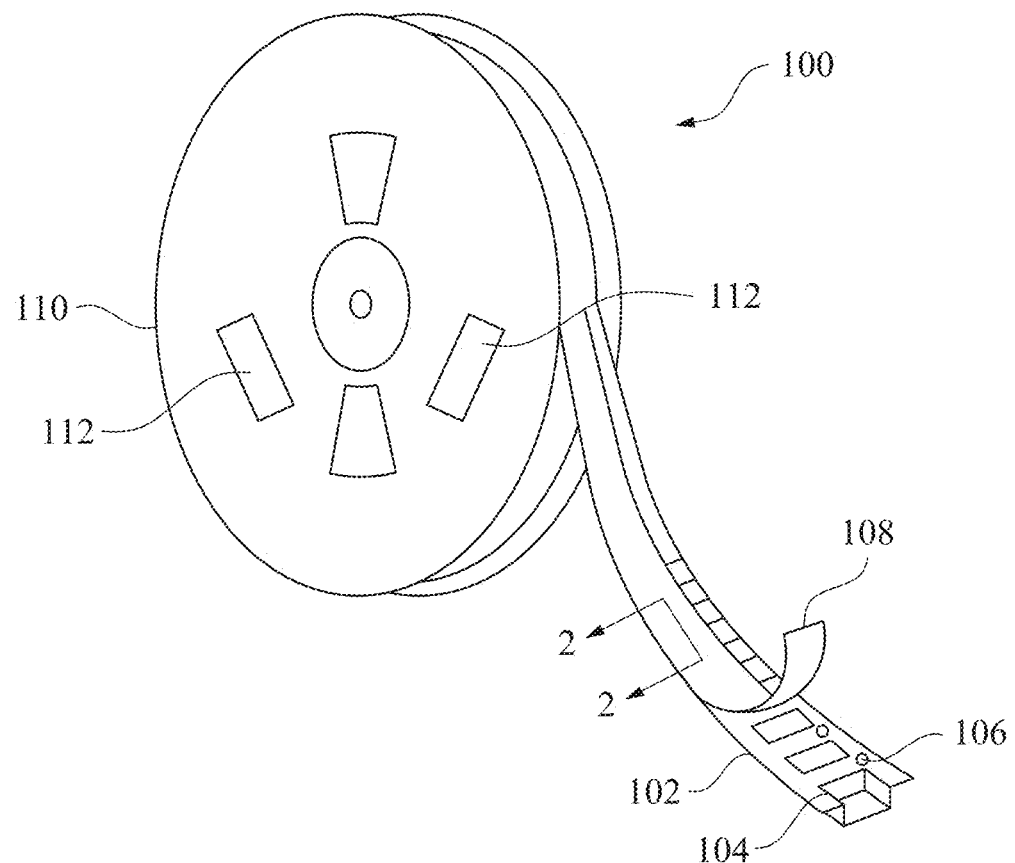
FIG. 1 illustrates an example tape and reel packaging system in accordance with embodiments of the present disclosure.

Techniques and structures in accordance with embodiments described herein are directed to novel carrier tape systems for semiconductor devices, methods of forming semiconductor device carrier tape systems and methods for supplying semiconductor devices to an apparatus, which in operation, places the semiconductor devices at desired locations. Embodiments of carrier tape systems and methods for supplying semiconductor devices for placement in accordance with the present disclosure experience fewer problems than conventional carrier tape systems and methods for supplying semiconductor devices with regard to semiconductor devices being damaged during packaging and transportation.

When semiconductor devices packaged in a carrier tape are transported, damage to the semiconductor device can occur when the semiconductor device contacts portions of the pocket. Corners of the semiconductor device are particularly susceptible to chipping and cracking when they contact walls or the bottom of the carrier tape pocket containing the semiconductor device.

Carrier tape systems in accordance with embodiments described herein include a carrier tape that includes a pocket for a semiconductor device. The pocket includes a bottom surface supporting a semiconductor device. Carrier tape systems in accordance with embodiments described herein include an adhesive positioned between the semiconductor device and the bottom surface of the pocket. The adhesive reversibly attaches the semiconductor device to the bottom surface of the carrier tape pocket. When the semiconductor device is reversibly attached to the bottom surface of the carrier tape pocket, it cannot contact sidewalls or the bottom surface of the pocket. Preventing the semiconductor device from contacting sidewalls or the bottom surface of the pocket reduces the likelihood that the semiconductor device will be damaged, for example, chipped or cracked.

In some embodiments, adhesive employed is a reversible adhesive which can be treated to reduce its adhesive strength. Examples of treatments of a reversible adhesive that reduce its adhesive strength include exposing the reversible adhesive to electromagnetic energy, thermal energy or magnetic fields. Examples of electromagnetic energy for treating the reversible adhesive and reducing its adhesive strength include ultraviolet radiation and infrared radiation. Examples of reversible adhesives include polyolefin bases adhesives, such as polyvinylchloride or polyethylene based adhesive.

Methods for forming a semiconductor device carrier system in accordance with embodiments described herein includes a step of providing a carrier tape including a plurality of pockets. The pockets of the carrier tape include a bottom surface upon which a semiconductor device is supported when a semiconductor device is placed in a pocket. The methods further include a step of positioning a layer of a reversible adhesive on a portion of the bottom surface of the pocket.

The positioning of a layer of a reversible adhesive on a portion of the bottom surface of the pocket can be accomplished in a number of ways. For example, in accordance with some embodiments of the present disclosure a preformed layer of reversible adhesive can be placed on the bottom surface of the pocket. In accordance with other embodiments of the present disclosure, a layer of a reversible adhesive is positioned on a portion of the bottom surface of a pocket by patterning a layer of reversible adhesive that is on the carrier tape. In additional embodiments, the layer of reversible adhesive on a portion of the bottom surface of the pocket is provided by applying a layer of reversible adhesive to a bottom surface of a semiconductor device and positioning the semiconductor device including a layer of adhesive on the bottom surface of the pocket.

Methods for supplying semiconductor devices to an apparatus, which in operation, places semiconductor devices at desired locations are also described. In an embodiment of such methods, the apparatus receives a carrier tape including a plurality of pockets. Each pocket of the carrier tape has a bottom surface and includes a semiconductor device adhered to the bottom surface of the pocket by an adhesive. The methods involve treating the adhesive to reduce an adhesion strength provided by the adhesive between the semiconductor device and the bottom surface of the pocket. After treatment of the adhesive, the semiconductor device is removed from the pocket and subjected to further processing, e.g., for example, placement.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of such features or a device in use or operation in addition to the orientation depicted in the figures. The features or device or apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques and tape and reel systems have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a schematic illustration of a tape and reel packaging system 100. The tape and reel packaging system 100 comprises a carrier tape 102. Exemplary materials for carrier tapes include plastic materials, for example polycarbonate, polystyrene or polyethylene terephthalate. The present disclosure is not limited to carrier tapes made from polycarbonate, polystyrene, or polyethylene terephthalate. Embodiments of the present disclosure can be applied to carrier tapes made from materials other than polycarbonate, polystyrene or polyethylene terephthalate. Carrier tape 102 can exhibit varying conductive and anti-static qualities to suit different applications; however, the present disclosure is not limited to carrier tapes that exhibit conductive or anti-static qualities. Carrier tape 102 includes pockets 104 for housing a component, e.g., a semiconductor device (not shown in FIG. 1). Semiconductor devices include discrete devices, integrated circuits and packaged semiconductor devices such as wafer level chip scale packages (WLCSP); however, the present disclosure is not limited to such types of semiconductor devices. Pockets 104 may be embossed into the carrier tape 102, for example, or may be formed in other ways that do not involve embossing. Pockets 104 may be polygonal in shape, e.g., square, rectangular, pentagonal, hexagonal, etc., or they may be non-polygonal in shape, e.g., round or oval. Pockets 104 include openings through which a component is passed when the component is placed in a pocket. Sprocket holes 106 may be provided along one or both margins of a top surface of the carrier tape 102. The sprocket holes 106 enable precise detection of the pockets 104 by a pick and place unit which is an example of an apparatus for removing components from carrier tape 102 and placing the removed components at desired locations. The pockets 104 are sealed with a cover tape 108 to hold in place components placed in the pockets 104. The cover tape includes an adhesive layer that includes a heat-activated adhesive (HAA) or a pressure-sensitive adhesive (PSA). Polyethylene is an example of an adhesive material that can be used as a primary component of a cover tape adhesive; however, embodiments of the present disclosure are not limited to using a cover tape adhesive having polyethylene as a primary component, cover tape adhesives containing other polymeric material as a major component can be used as a cover tape adhesive in accordance with the present disclosures. Embodiments in accordance with the present disclosure are not limited to cover tapes that utilize an HAA or PSA adhesive, e.g., embodiments of the present disclosure are applicable to cover tapes that utilize adhesives that are not HAA or PSA. In a taping process in which a cover tape 108 including an HAA is mated with a carrier tape 102, a heated sealing shoe presses the cover tape onto the edges of the carrier tape, thereby sealing the cover tape to the carrier tape. In an HAA taping process, time, heat, and pressure are controlled for achieving optimum adhesion. After cooling, if the temperature of the HAA is increased after the taping process, the HAA may soften and increase in tackiness/stickiness. In the taping process in which a cover tape 108 including a PSA is mated with a carrier tape 102, the cover tape adheres when pressure is applied. Heat is not required to activate the bond when a PSA is used. The carrier tape 102 sealed to the cover tape 108 by the adhesive is wound onto a reel 110. Labels 112 may be placed on the reel 110 comprising any kind of information, for example customer name, device part number, product date code, and quantity in the reel. Bar codes may be part of the labels.

Figure 2A:
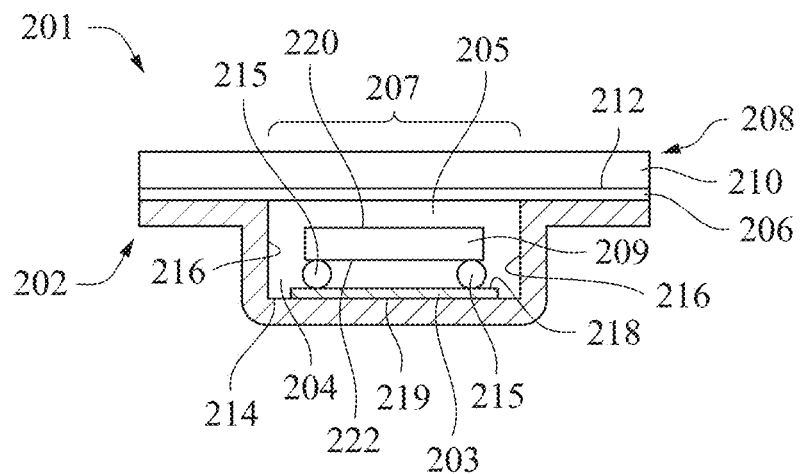
FIGS. 2A and 2B illustrate a cross-section of two embodiments of the carrier tape system of FIG. 1, along line 2-2.

An embodiment of a carrier tape system 201 in accordance with the present disclosure is illustrated in FIG. 2A. FIG. 2A illustrates a cross-section taken along line 2-2 in FIG. 1. Due to the scale of FIG. 1, certain details of carrier tape system 201, including carrier tape 202, cover tape 208 and pockets 204 illustrated in FIG. 2A are not apparent in FIG. 1. Carrier tape system 201 includes cover tape 208 and an underlying carrier tape 202. Carrier tape 202 includes a plurality of pockets 204 (though only one such pocket is illustrated in FIG. 2A) in which a semiconductor die 209 is located. Pocket 204 includes a bottom surface 214 and sidewalls 216. Semiconductor die 209 includes an upper surface 220 facing opening 205 through which the semiconductor die 209 is passed when the semiconductor die is placed into pocket 204. Semiconductor die 209 also includes a lower surface 222 facing the bottom surface 214 of pocket 204. In the embodiment illustrated in FIG. 2A, solder balls 215 are present on the lower surface 222 of semiconductor die 209. In accordance with other embodiments of the present disclosure, semiconductor die 209 does not include solder balls 215 on the lower surface 222 of semiconductor die 209. In the illustrated embodiment, pocket 204 is illustrated as having a square shape; however, pocket 204 can have shapes other than square, for example, other polygon shapes, circular or oval. Carrier tape 208 is formed from plastic materials, such as polycarbonate, polystyrene or polyethylene terephthalate. Carrier tapes in accordance with the present embodiments are not limited to being formed from polycarbonate, polystyrene or polyethylene terephthalate and may be formed from other suitable plastic materials.

In the illustrated embodiment, cover tape 208 includes a layer of cover tape-base material 210 and a layer of cover tape adhesive 206. Cover tape base material 210 is formed from plastic materials, such as polyethylene terephthalate. Cover tapes in accordance with the present embodiments are not limited to being formed from polyethylene terephthalate and may be formed from other suitable plastic materials. In FIG. 2A, cover tape base material 210 includes a covering portion 207 positioned over opening 205 and pocket 204. In the embodiment illustrated in FIG. 2A, covering portion 207 is located directly over opening 205 and pocket 204. In the illustrated embodiment of FIG. 2A, a layer of cover tape adhesive 206 is between the underside 212 of cover tape base material 210 and a top side of underlying carrier tape 202. The layer of cover tape adhesive 206 secures portions of carrier tape 202 contacting the layer of cover tape adhesive 206 to portions of cover tape base material 210 contacting the layer of adhesive 206. In the embodiment illustrated in FIG. 2A, a layer of adhesive 203 is present on the bottom surface 214 of pocket 204. Layer of adhesive 203 includes an upper surface 218 facing the lower surface 222 of semiconductor die 209 and in contact with solder balls 215. For embodiments where the lower surface 222 of semiconductor die 209 does not include solder balls 215, layer of adhesive 203 contacts the lower surface 222 of semiconductor die 209. Layer of adhesive also includes a lower surface 219 facing the bottom surface 214 of pocket 204.

Figure 3A:
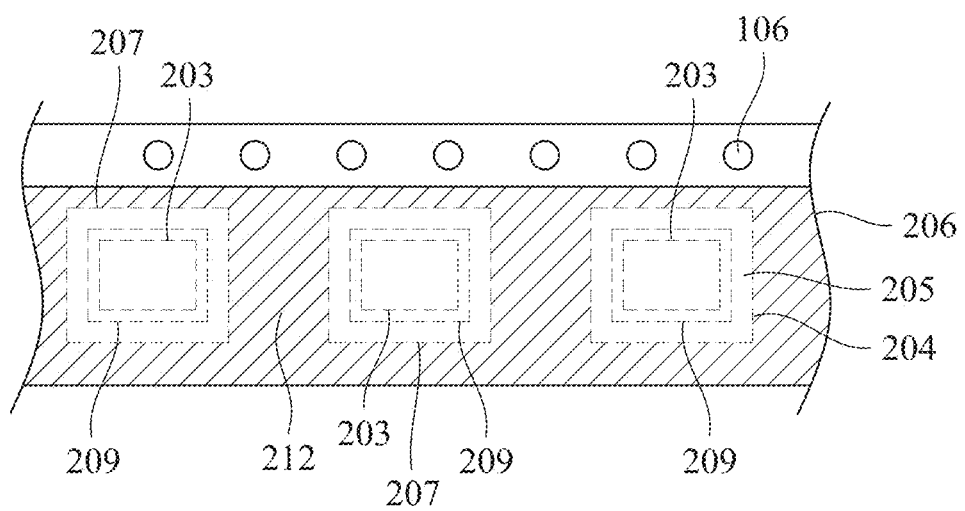
FIGS. 3A and 3B illustrate a top view of the carrier tape systems according to embodiments of the present disclosure illustrated in FIGS. 2A and 2B respectively.

FIG. 3A illustrates a top view of carrier tape system 201 of FIG. 2A. To aid in the understanding of embodiments described herein, in FIG. 3A, cover tape-base material 210 is illustrated as being transparent; however, embodiments described herein are not limited to cover tape base material 210 being transparent. Cover tape base material 210 may be translucent or opaque. FIG. 3A illustrates an embodiment wherein pocket 204 and opening 205 of carrier tape 202 are substantially congruent (e.g., have substantially the same size, for example length and width dimensions, and substantially the same shape, for example square. Thus, pocket 204 and opening 205 are both represented by the same broken line because opening 205 is essentially superimposed over pocket 204. Semiconductor die 209 within pocket 204 is also depicted in broken lines. Adhesive layer 203 is also illustrated in broken lines in FIG. 3A. FIG. 3A illustrates embodiments in accordance with the present disclosure where the length and width dimensions of the adhesive layer 203 are less than the length and width dimensions of semiconductor die 209. In accordance with other embodiments of the present disclosure illustrated with reference to FIG. 3B, the length and width dimensions of the adhesive layer 203 are greater than the length and width dimensions of semiconductor die 209.

Figure 2B:
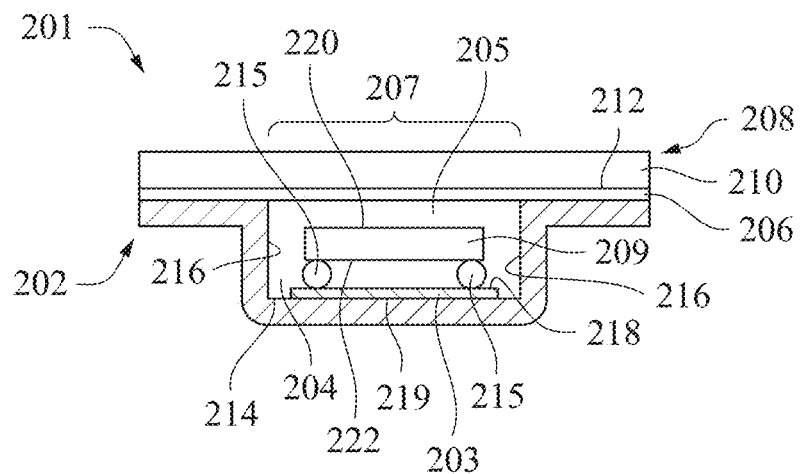
Figure 3B:
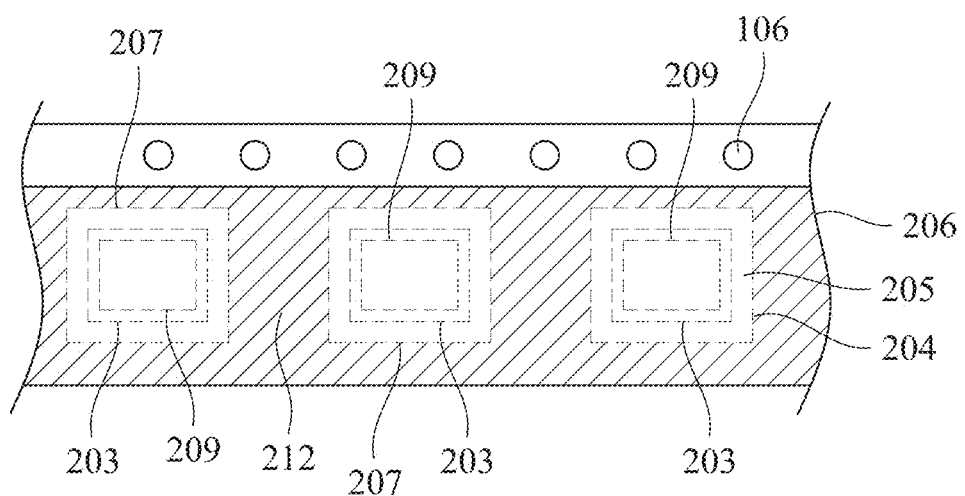

FIGS. 2B and 3B, depict an alternative embodiment of a carrier tape system in accordance with the present disclosure, wherein the length and width dimensions of adhesive layer 203 are greater than the length and width dimensions of the semiconductor die 209 is illustrated. FIGS. 2B and 3B use the same reference numerals for the same features as used in FIGS. 2A and 3A. In FIGS. 2B and 3B, adhesive layer 203 is illustrated in broken lines in FIG. 3B. FIG. 3B illustrates embodiments in accordance with the present disclosure where the length and width dimensions of the adhesive layer 203 are greater than the length and width dimensions of semiconductor die 209.

In accordance with embodiments of the present disclosure, adhesive layer 203 adheres semiconductor die 209 to bottom surface 214 of pocket 204. Adhering semiconductor die 209 to the bottom surface 214 of pocket 204 secures semiconductor die 209 to bottom surface 214 of pocket 204 in a manner that prevents semiconductor die 209 from shifting or moving within pocket 204, e.g., during packaging of the semiconductor die in pocket 204 or transportation of the carrier tape system 201. Restricting the shifting or moving of semiconductor die 209 within pocket 204 prevents semiconductor die 209 from coming in contact with the bottom surface 214 or sidewalls 216 of pocket 204. Preventing contact of semiconductor die 209 with bottom surface 214 or sidewalls 216 of pocket 204 minimizes or prevents damage, e.g., cracking or chipping, to semiconductor die 209 caused by the semiconductor die contacting bottom surface 214 or sidewalls 216 of pocket 204. Though not illustrated, in alternative embodiments, adhesive layer 203 can be provided on one or more of sidewalls 216 for securing semiconductor die 209 to one or more of sidewalls 216.

Suitable adhesives include adhesives that are compatible with the semiconductor die 209 or solder balls 215 and the bottom surface 214 or sidewalls 216 of pocket 204. In accordance with embodiments of the present disclosure, adhesive layer 203 is formed of a non-reversible adhesive or a reversible adhesive. A non-reversible adhesive is an adhesive that provides an adhesion strength which is substantially constant. In contrast, a reversible adhesive is an adhesive that provides in adhesion strength which can be changed by treating the reversible adhesive. Non-reversible adhesives are adhesives that provide an adhesive strength between the semiconductor die 209 and the bottom surface 214 of pocket 204 which is strong enough to hold the semiconductor die in place after the die is placed in the pocket and during transportation in the carrier tape system, yet not so strong as to impede removal of the semiconductor die from the pocket by a pick and place apparatus. Stated a different way, the non-reversible adhesive provides an adhesive strength that is greater than the forces exerted on the semiconductor die after placement in the pocket and during transportation in the carrier tape system, yet not so great as to prevent a pick and place apparatus from being able to separate the die from the adhesive.

A reversible adhesive useful in accordance with embodiments of the present disclosure is an adhesive that can be treated to modify its adhesion strength. Reversible adhesives are adhesives that provide an adhesive strength between the semiconductor die 209 and the bottom surface 214 of pocket 204 which is strong enough to hold the semiconductor die in place after the die is placed in the pocket and during transportation in the carrier tape system, yet upon treatment provide an adhesion strength that is low enough so as not to prevent removal of the semiconductor die from the pocket by a pick and place apparatus. Stated a different way, the reversible adhesive provides an adhesive strength that is greater than the forces exerted on the semiconductor die after placement in the pocket and during transportation in the carrier tape system, and after treatment, provides an adhesive strength that is not so great as to prevent a pick and place apparatus from being able to separate the die from the adhesive.

In accordance with embodiments of the present disclosure, polyolefin based adhesives, such as polyvinylchloride, polyethylene-based adhesives such as polyethylene terephthalate and acrylic adhesives are examples of suitable adhesives for use in embodiments of the present disclosure. Suitable non-reversible adhesives provide an adhesive strength of about 30 mN/mm or more. Non-reversible adhesives are not limited to those that can provide an adhesive strength of about 30 mN/mm or more. Non-reversible adhesives useful in accordance with embodiments of the present disclosure include non-reversible adhesives that provide an adhesive strength of less than 30 mN/mm and greater than about 8 mN/mm. In embodiments in accordance with the present disclosure, the non-reversible adhesives are capable of holding the semiconductor die in place within the pocket of the carrier tape and do so by providing an adhesive strength less than about 30 mN/mm and greater than about 5 mN/mm. In accordance with other embodiments of the present disclosure, reversible adhesives provide an adhesive strength of about 30 mN/mm or more before treatment. Suitable reversible adhesives are not limited to those that can provide an adhesive strength of about 30 mN/mm or more before treatment. Reversible adhesives useful in accordance with embodiments of the present disclosure include reversible adhesives that provide an adhesive strength of less than 30 mN/mm and greater than about 8 mN/mm before treatment. In embodiments in accordance with the present disclosure, the reversible adhesives, like the non-reversible adhesives are capable of holding the semiconductor die in place within the pocket of the carrier tape before treatment by providing an adhesive strength less than about 30 mN/mm and greater than about 5 mN/mm. The non-reversible adhesives useful in accordance with embodiments of the present disclosure providing adhesive strength after treatment is low enough, such that, an apparatus (e.g., a pick and place apparatus) which removes the semiconductor device from the pocket of the carrier tape and places it at a desired location is able to separate the semiconductor device from the adhesive within the pocket of the carrier tape. In accordance with embodiments of the present disclosure, reversible adhesives can be treated to reduce their adhesive strength to about 8 mN/mm or less. Reversible adhesives which exhibit an adhesive strength greater than about 8 mN/mm after treatment are also useful in accordance with the present disclosure, e.g., in situations where the pick and place apparatus that receives the carrier tape is able to separate the semiconductor device from the adhesive when the treated adhesive provides an adhesive strength of greater than about 8 mN/mm.

In accordance with some embodiments of the present disclosure, the adhesive strength of reversible adhesives can be modified, e.g., lowered, by treatment involving an exposure to a source of energy. The source of energy can be a source of electromagnetic or thermal energy. Examples of sources of electromagnetic energy include sources of infrared radiation or ultraviolet radiation. Sources of thermal energy include sources of radiant thermal energy or infrared thermal energy. Embodiments of the present disclosure, also contemplate use of reversible adhesives for which their adhesive strength can be reduced by exposure to magnetic fields. The particular source of energy utilized can be chosen to minimize or avoid adverse impacts on the semiconductor die.

The thickness of the layer of adhesive positioned on the bottom surface of the pocket is sufficient to provide a sufficient adhesion between the semiconductor die and the bottom surface of the pocket. In accordance with embodiments of the present disclosure, the layer of adhesive is about 0.002 mm to about 0.180 mm thick. Embodiments of the present disclosure are not limited to layers of adhesive having a thickness between about 0.002 mm to about 0.180 mm thick, the layer of adhesive can be thinner or thicker than this representative range of thickness. As illustrated in FIG. 3A, the surface area of an upper surface 218 of the adhesive layer 203 is less than the surface area of the upper surface 220 of the semiconductor die 209. Embodiments of the present disclosure are not limited to an adhesive layer that has a surface area of its upper surface less than the surface area of the upper surface of the semiconductor die. For example, as illustrated in FIG. 3B, the surface area of an upper surface 218 of the adhesive layer 203 is greater than the surface area of the upper surface 220 of the semiconductor die 209. In accordance with other embodiments, the surface area of the upper surface 220 of the adhesive layer 203 is equal to the surface area of the upper surface 220 of the semiconductor die 209.

Figure 4:
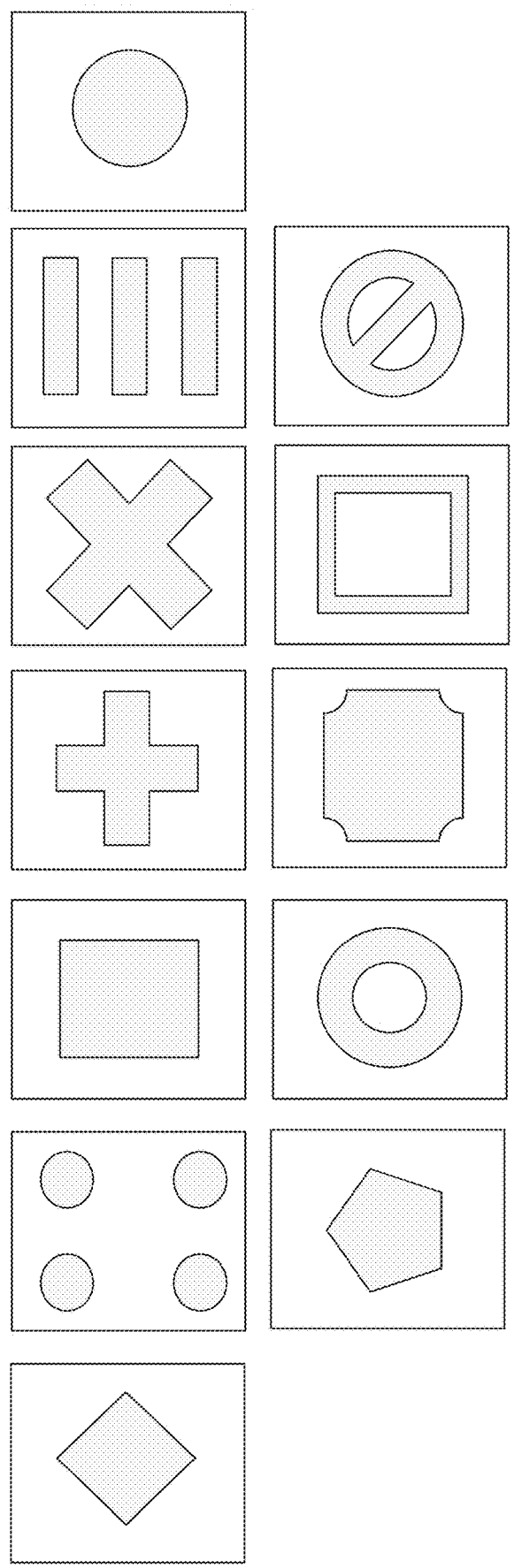
FIG. 4 illustrate alternative embodiments in accordance with the present disclosure.

In the embodiments illustrated in FIGS. 3A and 3B, the adhesive layer 203 has a shape when viewed from above, that is rectangular. Embodiments of the present disclosure are not limited to an adhesive layer 203 that has a shape when viewed from above, that is rectangular. For example, FIG. 4 illustrates a top view of a plurality of other shapes or arrays of adhesive material that can be used to provide adhesive layer 203 on bottom surface 214 of pocket 204. Embodiments of the present disclosure are not limited to adhesive layers that have rectangular shape or limited to the shapes illustrated in FIG. 4.

Figure 5:
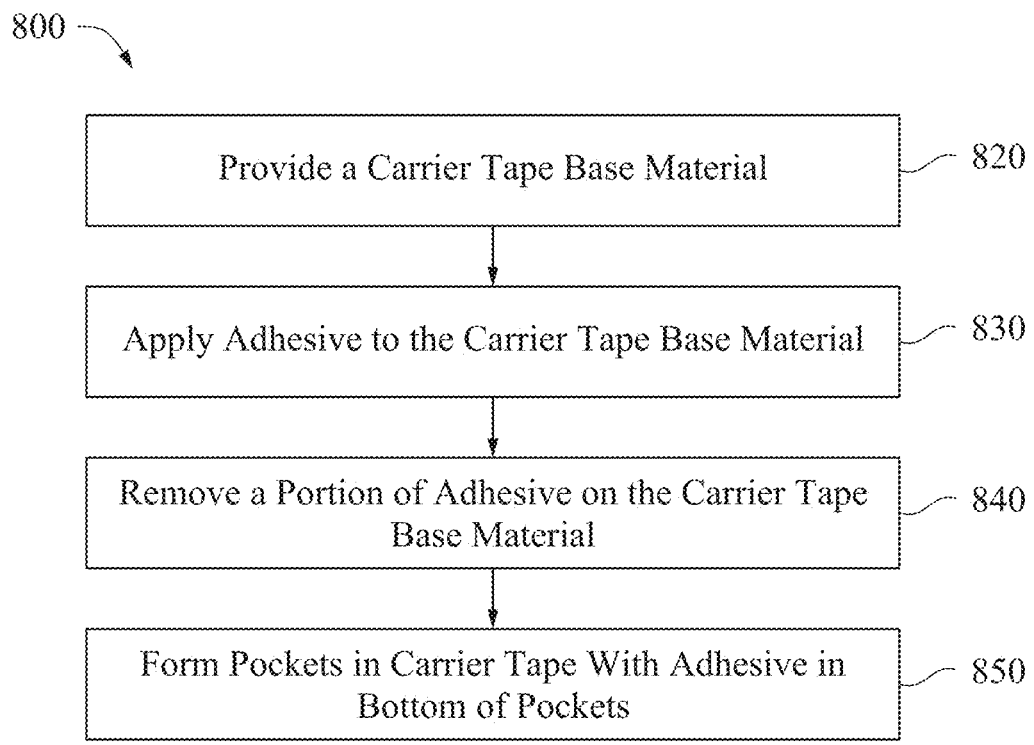
FIG. 5 illustrates an embodiment of methods for making carrier tapes in accordance with the present disclosure.

In accordance with embodiments described herein, methods for producing carrier tapes in accordance with embodiments described herein include, an operation 800 illustrated in FIG. 5. In the embodiment illustrated in FIG. 5, an adhesive is applied to a carrier tape prior to formation of the pockets in the carrier tape. The adhesive is then patterned to remove portions of the adhesive occupying portions of the carrier tape that will not form a bottom surface of pockets formed in the carrier tape. The illustrated operation 800 includes providing a carrier tape base material at step 820. An adhesive is applied to the carrier tape base material at step 830. The adhesive is applied to the carrier tape base material by spraying the adhesive on the carrier tape base material, or using another technique that results in formation of film of adhesive having a uniform thickness on the carrier tape base material. For example, instead of spraying adhesive on the carrier tape base material, a film of adhesive can be applied to a surface of the carrier tape base material. Subsequently, a portion of the adhesive on the carrier tape base material is removed (step 840) to define adhesion areas on the carrier tape base material which coincide to a surface of pockets to be formed in the carrier tape where the presence of an adhesive is desired, e.g., the bottom surface or sidewall surfaces of the pocket. The portions of the adhesive on the carrier tape can be removed by punching through the adhesive layer without punching through the underlying carrier tape or using other techniques capable of removing portions of the applied adhesive from the carrier tape without damaging the underlying carrier tape. Portions of the adhesive layer removed from the carrier tape by punching can be recovered and processed so that the recovered adhesive can be applied to another carrier tape in subsequent processes. In step 850, after removal of selected portions of the adhesive layer, the carrier tape base material can be further processed to form pockets in the carrier tape base material. In an alternative embodiment, the carrier tape base material has pockets formed in it prior to the application of the adhesive, whether by spraying, or the application of an adhesive film. In accordance with this alternative embodiment, after the adhesive is applied to the carrier tape including the pockets, portions of the adhesive not present on the bottom surface of the pockets, or the sidewall of the pockets is removed.

Figure 6:
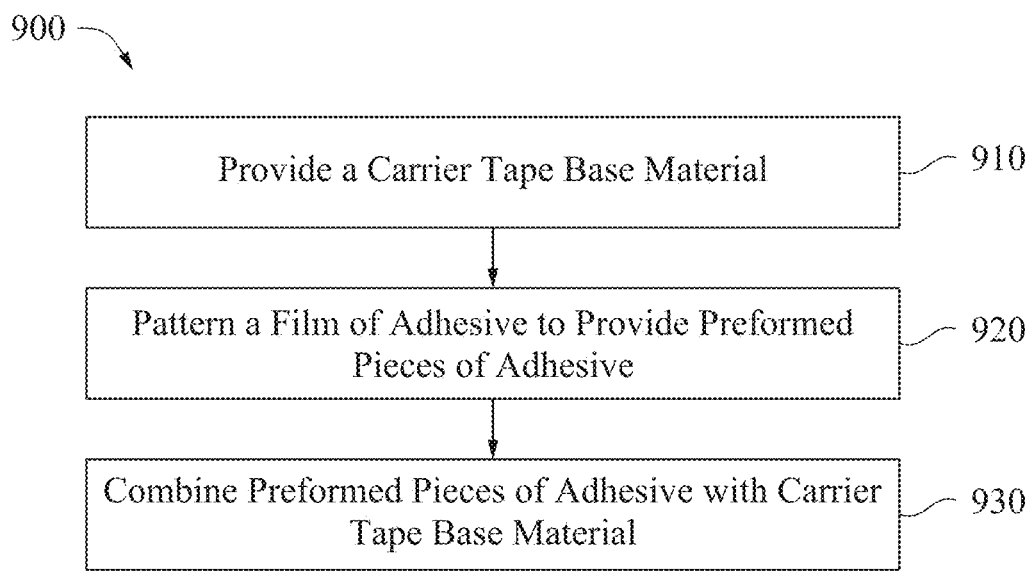
FIG. 6 illustrates an alternative embodiment of methods for making carrier tapes in accordance with the present disclosure.

Another embodiment, for producing carrier tapes in accordance with the embodiments described herein, includes an operation 900 illustrated in FIG. 6. The illustrated operation 900 includes a step 910 of providing a carrier tape base material with pockets formed therein. At step 920, a film of adhesive is patterned, e.g., by punching or cutting the film of adhesive to form preformed pieces of adhesive. The resulting preformed pieces of adhesive are sized to fit on the bottom surface or sidewall of the pockets. The preformed pieces of adhesive are then combined with the carrier tape base material at step 930 to provide adhesive on the bottom surface of the pockets, or sidewalls of the pockets. Portions of the adhesive removed by the patterning can be recovered and processed so that the recovered adhesive can be used to form another adhesive film which can be used, to form additional patterned preformed pieces of adhesive.

Figure 7:
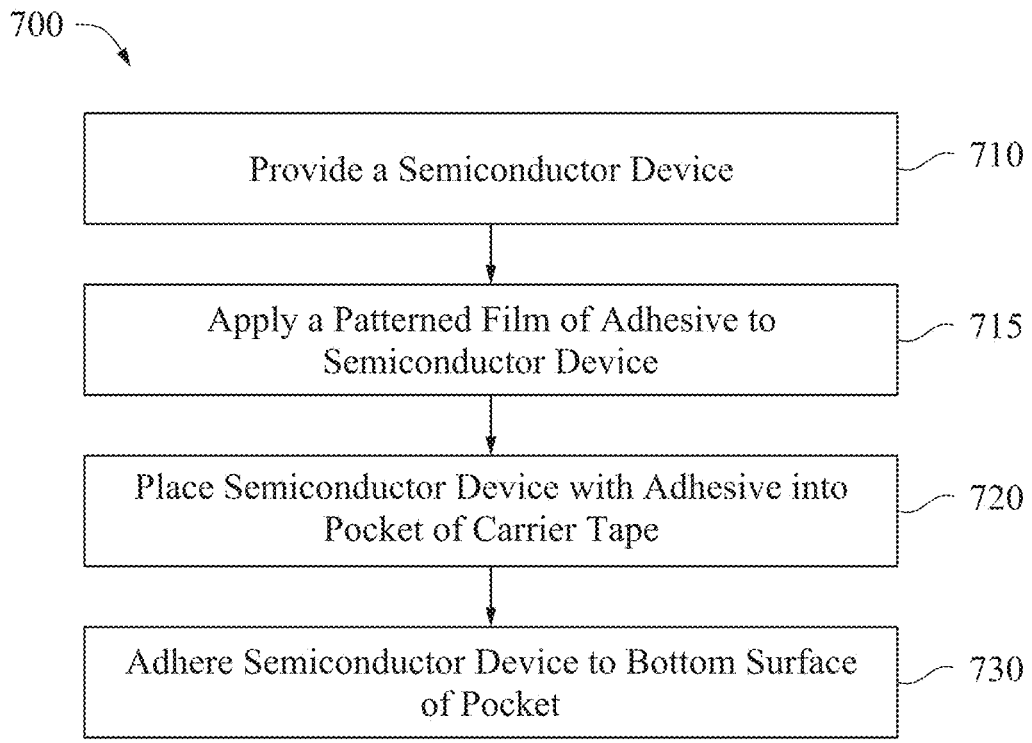
FIG. 7 illustrates an alternative embodiment of methods for making carrier tapes in accordance with the present disclosure.

Another embodiment for producing a carrier tape in accordance with embodiments described herein, includes, an operation 700 illustrated in FIG. 7. The illustrated operation 700 includes providing a carrier tape base material including pockets formed therein at step 710. At step 715, a patterned preformed piece of adhesive is applied to a bottom surface of a semiconductor die. The semiconductor die, including the preformed piece of adhesive, is placed into a pocket of the carrier tape base material at step 720. At step 730, the semiconductor die is adhered to the bottom surface of a pocket by the preformed piece of adhesive.

Figure 8:
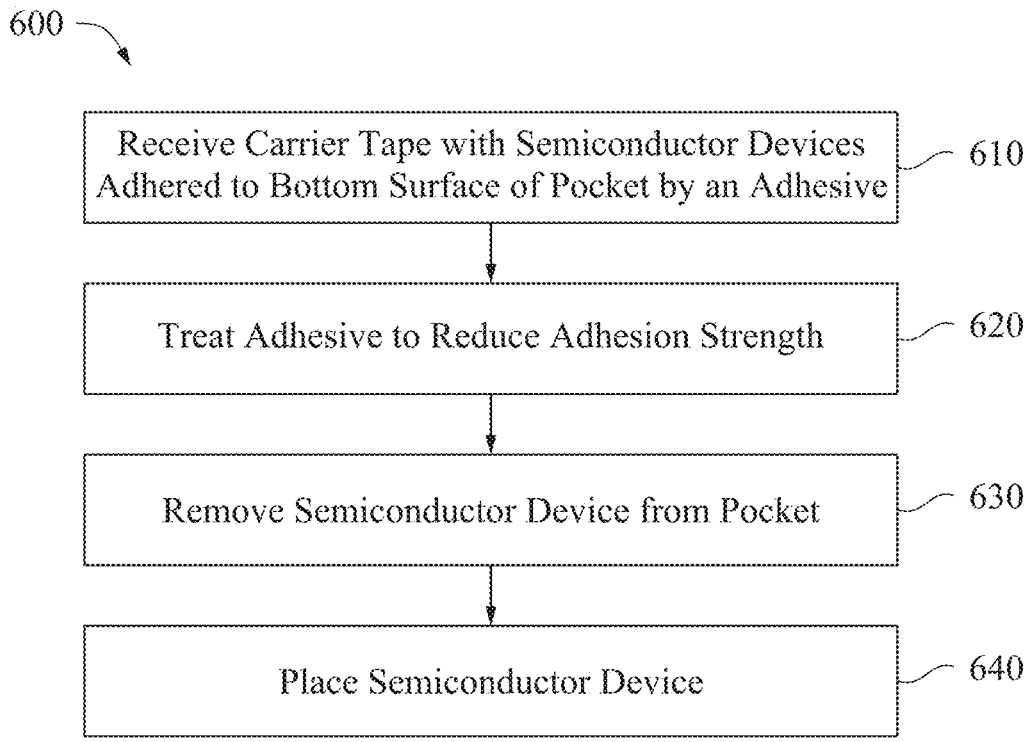
FIG. 8 illustrates an embodiment of methods for supplying semiconductor devices to a semiconductor placement apparatus in accordance with embodiments of the present disclosure.

In accordance with other embodiments of the present disclosure, methods for supplying semiconductor devices to an apparatus, such as a pick and place apparatus, include, in operation 600 illustrated in FIG. 8. One embodiment of such Operation 600 includes a step 610 of receiving a carrier tape with semiconductor devices adhered by an adhesive to a bottom surface of pockets formed in the carrier tape. At step 620, the adhesive is treated, e.g., exposure to ultraviolet radiation or thermal energy, to reduce its adhesion strength. After the adhesion strength of the adhesive has been reduced by the treatment, the semiconductor device is removed from the pocket by the pick and place apparatus at step 630. At step 640, the removed semiconductor is placed at a desired location by the pick and place apparatus.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments.

In a carrier tape system embodiment, the carrier tape system includes a carrier tape including a pocket for a semiconductor device, wherein the pocket includes a bottom surface for supporting the semiconductor device. The carrier tape system further includes an adhesive positioned between the semiconductor device and the bottom surface of the pocket to adhere a semiconductor device to the bottom surface of the pocket. In some embodiments, the adhesive is a reversible adhesive whose adhesive strength can be modified by exposing the adhesive to a source of energy, such as ultraviolet radiation or thermal energy.

Embodiments of a method for supplying semiconductor devices to an apparatus, which in operation, places a semiconductor device at desired locations includes a step of receiving at the apparatus a carrier tape including a plurality of pockets. Each of the pockets has a bottom surface and includes a semiconductor device adhered to the bottom surface of the pocket by an adhesive. In accordance with these embodiments, the adhesive is treated to reduce an adhesion strength provided by the adhesive between the semiconductor device and the bottom surface of the pocket. After the adhesive has been treated, the semiconductor device is removed from the pocket for further processing, e.g., placement of the semiconductor device at a desired location.

Embodiments of methods of forming a semiconductor device carrier system include providing a carrier tape including a plurality of pockets, each pocket including a bottom surface upon which a semiconductor device is supported when the semiconductor device is placed in a pocket. The methods include positioning a layer of a reversible adhesive on a portion of the bottom surface of the pocket. The reversible adhesive serves to secure the semiconductor device to the bottom surface of the pocket. The adhesive strength between the semiconductor device and the bottom surface of the pocket provided by the reversible adhesive is modified by exposing the reversible adhesive to an energy source, e.g., source of ultraviolet radiation or thermal energy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A carrier tape system for a semiconductor device, the carrier tape system comprising:
    a semiconductor device having a lower surface, a length dimension and a width dimension;
    a carrier tape including a pocket, the pocket including a bottom surface supporting the semiconductor device and a sidewall;
    an adhesive on the sidewall; and
    an adhesive contacting the lower surface of the semiconductor device and positioned between the semiconductor device and the bottom surface of the pocket, the adhesive contacting the lower surface of the semiconductor device having a length dimension that is less than the length dimension of the semiconductor device and a width dimension that is less than the width dimension of the semiconductor device, wherein the adhesive on the sidewall does not contact the adhesive contacting the lower surface of the semiconductor device.

2. The carrier tape system of claim 1, wherein the adhesive is a reversible adhesive.

3. The carrier tape system of claim 2, wherein the reversible adhesive is a polyolefin and an adhesion strength between the semiconductor device and the bottom of the carrier tape is reduced when the polyolefin is exposed to a source of energy.

4. The carrier tape system of claim 3, wherein the source of energy is a source of electromagnetic energy or thermal energy.

5. The carrier tape system of claim 4, when the source of electromagnetic energy is a source of ultraviolet radiation.

6. The carrier tape system of claim 1, wherein the adhesive has a shape that is the same as the shape of the bottom of the pocket.

7. The carrier tape system of claim 1, wherein the adhesive has a shape that is different from the shape of the bottom of the pocket.

8. The carrier tape system of claim 1, wherein the adhesive contacting the lower surface of the semiconductor device has a surface area that is less than or equal to a surface area of the lower surface of the semiconductor device.

9. The carrier tape system of claim 1, wherein the adhesive on the sidewall is between the semiconductor device and the sidewall of the pocket.

10. A carrier tape system for a semiconductor device, the carrier tape system comprising:
    a carrier tape including a plurality of pockets and a patterned layer of a reversible adhesive, a pocket of the plurality of pockets including a bottom surface and a sidewall, wherein
    the patterned layer of a reversible adhesive is positioned on the bottom surface of the pocket of the plurality of pockets, wherein an adhesive strength of the patterned layer of reversible adhesive is reduced when the patterned layer of reversible adhesive is exposed to a source of energy and the patterned layer of reversible adhesive has a length dimension that is less a length dimension of a semiconductor device to be received in the pocket and a width dimension that is less than the width dimension of the semiconductor device to be received in the pocket; and
    an adhesive on the sidewall of the pocket, the adhesive on the sidewall of the pocket not in contact with the patterned layer of reversible adhesive positioned on the bottom surface of the pocket.

11. The carrier tape system for a semiconductor device of claim 10, wherein the reversible adhesive provides an adhesive strength of about 30 mN/mm prior to being exposed to the source of energy.

12. The carrier tape system for a semiconductor device of claim 10, wherein the adhesive strength of the reversible adhesive is reduced when the reversible adhesive is exposed to electromagnetic energy, thermal energy, infrared radiation, ultraviolet radiation or a magnetic field.

13. The carrier tape system for a semiconductor device of claim 10, wherein the reversible adhesive positioned on the bottom surface of the pocket has a rectangular shape.

14. The carrier tape system for a semiconductor device of claim 10, wherein the reversible adhesive positioned on the bottom surface of the pocket is 0.002 mm to 0.180 mm thick.

15. A carrier tape system for a semiconductor device, the carrier tape system comprising:
    a semiconductor device having a lower surface, a length dimension and a width dimension;
    a carrier tape including a pocket, the pocket including a bottom surface supporting the semiconductor device and a sidewall;
    an adhesive on the sidewall; and
    a non-reversible adhesive contacting the lower surface of the semiconductor device and positioned between the semiconductor device and the bottom surface of the pocket, the adhesive contacting the lower surface of the semiconductor device having a length dimension that is less than the length dimension of the semiconductor device and a width dimension that is less than the width dimension of the semiconductor device, wherein the adhesive on the sidewall does not contact the adhesive contacting the lower surface of the semiconductor device.

16. The carrier tape system for a semiconductor device of claim 15, wherein the non-reversible adhesive provides an adhesive strength between the semiconductor device and the bottom surface of the pocket which is strong enough to hold the semiconductor die in place after the die is placed in the pocket and transported in the carrier tape system.

17. The carrier tape system for a semiconductor device of claim 16, wherein the adhesive strength between the semiconductor device and the bottom surface of the pocket provided by the non-reversible adhesive does not prevent removal of the semiconductor device from the pocket by a pick and place apparatus.

18. The carrier tape system for a semiconductor device of claim 15, wherein the adhesive strength of the non-reversible adhesive is less than 30 mN/mm and greater than 5 mN/mm.

19. The carrier tape system for a semiconductor device of claim 15, wherein the non-reversible adhesive positioned between the semiconductor device and the bottom surface of the pocket is 0.002 mm to 0.180 mm thick.

20. The carrier tape system for a semiconductor device of claim 15, wherein the non-reversible adhesive is applied to the semiconductor device before the semiconductor device is placed in the pocket.

* * * * *